United States Patent [19]

Ramer

[11] 4,213,085
[45] Jul. 15, 1980

[54] PHASE INVERSION TEST DEVICE

[76] Inventor: Daniel J. Ramer, 4 Hillside Rd., Kinnelon, N.J. 07405

[21] Appl. No.: 937,244

[22] Filed: Aug. 28, 1978

[51] Int. Cl.² ............... G01R 27/00; G01R 19/16; G01R 19/14
[52] U.S. Cl. ............... 324/57 R; 324/103 P; 324/133; 340/657
[58] Field of Search ............... 324/57 R, 133, 122, 324/103 P, 83 D, 76 R; 340/657, 658

[56] References Cited
U.S. PATENT DOCUMENTS

| | | | |
|---|---|---|---|
| 2,956,228 | 10/1960 | Koelle | 324/103 P |
| 3,044,734 | 7/1962 | Heppe | 324/57 R |
| 3,076,901 | 2/1963 | Rubin et al. | 324/133 |

Primary Examiner—Rudolph V. Rolinec
Assistant Examiner—Ernest F. Karlsen
Attorney, Agent, or Firm—Nathan Edelberg; Robert P. Gibson; Max Yarmovsky

[57] ABSTRACT

A device for testing phase inversion of a circuit includes a signal generator having an assymetrically shaped positive phased test signal output electrically connected through a buffer circuit to the input of the circuit under test. A differentiator circuit electrically connected to the output of the test circuit, produces in response to the test circuit output, rectangular pulses whose amplitudes are proportional to the slopes of the test waveform. The differentiated output signals are isolated into positive and negative signals by a plurality of peak detectors whose outputs are fed to a summing amplifier. The summing amplifier amplifies the difference between the positive and negative isolated peak voltages and in turn drives a polarity indicating device which was previously calibrated to indicate a positive or negative polarity as either a phase or non-phase inversion. An alternate mode of measuring pulses directly and bypassing the differentiator is also provided.

8 Claims, 2 Drawing Figures

PHASE INVERSION TEST DEVICE

GOVERNMENTAL INTEREST

The invention described herein may be manufactured, used and licensed by or for the Government for governmental purposes without the payment to me of any royalty thereon.

BACKGROUND OF THE INVENTION

Various means have been used in the prior art to evaluate electronic circuitry signal processing performance. One measurement that was used in the past that is indicative of the fidelity of performance of the signal processing circitry, that is where the output is intended to faithfully resemble the input, is the phase relationship of the output with respect to the input.

A prior art diagnostic technique included the visual evaluation of wave forms by observing input and output signals on a dual channel oscilloscope. Although this prior art technique was effective in frequently caused problems because the instrumentation was expensive to purchase, complex to operate, difficult to interpret, and rarely easily portable. This technique requires knowledge of both the instrumentation and the nature of the observed waveforms. For example in an acoustic environment all frequencies of the signal are delayed by the propagation time from loudspeaker to microphone. A delay of approximately one foot per millisecond in propagation time represents a substantial error imparted to the aforementioned phase measurement test device. Another problem with checking phase in acoustic environments is the fact that loudspeakers are generally nonlinear in frequency response and therefore phase. Thus, the harmonics of a test signal will usually undergo a phase shift with respect to a test signal fundamental frequency, distorting the visual integrity of the test waveform. In order to overcome this problem as operator frequently must test at multiple frequencies and then either integrate by eye or average the curves using his best judgement. Similar problems are encountered in other circuitry not having a flat frequency response characteristics, such as transmission lines and transmission media.

Another method used in the prior art to evaluate circuit performance was to sum the input and output waveforms from a system under test. A large peak-to-peak voltage would indicate an in-phase condition. A low or zero peak-to-peak voltage would indicate an out-of-phase condition. The first problem with this technique is that it only works if the input and output amplitudes of the signal are normalized or made equal peak-to-peak. A second requirement is that the propagation delay through the system under test be negligible compared to the test signal wavelength. Thirdly, it must be practical to connect both the input and the output of the system under test to the analysis tool.

SUMMARY OF THE INVENTION

The present invention relates to a servicing and installaion diagnostic device for evaluating the performance of signal processing circuitry where the output signal is intended to accurately resemble the input signal. The present invention comprises two main assemblies, an assymetrical signal source electrically coupled to the input of the circuit under test and a signal processor electrically connected to the output of the circuit under test. The signal processor circuitry has the capability of analyzing either repetative or nonrepetative assymetrical waveforms to indicate throughput phase from either an acoustical signal source or by a direct connection to circuitry under test. By definition assymetrical is here defined as meaning that either an input test signal waveform or any of its derivatives contains a peak amplitude above its own average which is different than the peak amplitude below its own average.

An object of the present invention is to provide a phase measurement device for determining the presence of a phase inversion by an item under test.

Another object of the present invention is to provide a phase measurement device wherein the input amplitude of the test signal and the output amplitude of a test circuit do not have to be normalized or made equal peak-to-peak.

Another object of the present invention is to provide a phase measurement device, for evaluating the performance of a circuit under test, which is not affected by the propagation delay of a test signal through a system under test and, therefore, does not require that the propagation delay be negligible compared to a test signal wavelength.

Another object of the present invention is to provide a phase measurement device, for evaluating the performance of a circuit under test, which does not require the input and output terminals of the circuit under test to be electrically coupled to the phase measurement signal processor, permitting the measurement of systems with widely separated inputs and outputs.

Another object of the present invention is to provide a phase measurement device, for evaluating the performance of a circuit under test, which is relatively small, inexpensive, highly portable and requires little training to operate.

A further object of the present invention is to provide a phase measurement device, for evaluating the performance of a circuit under test, in seconds or a fraction of a second, indicating phase for both constant and nonconstant frequency response systems.

For a better understanding of the present invention, together with other and further objects thereof, reference is made to the following descriptions taken in connection with the accompanying drawings.

DESCRIPTION OF THE PREFERRED EMBODIMENTS

Figure 1:
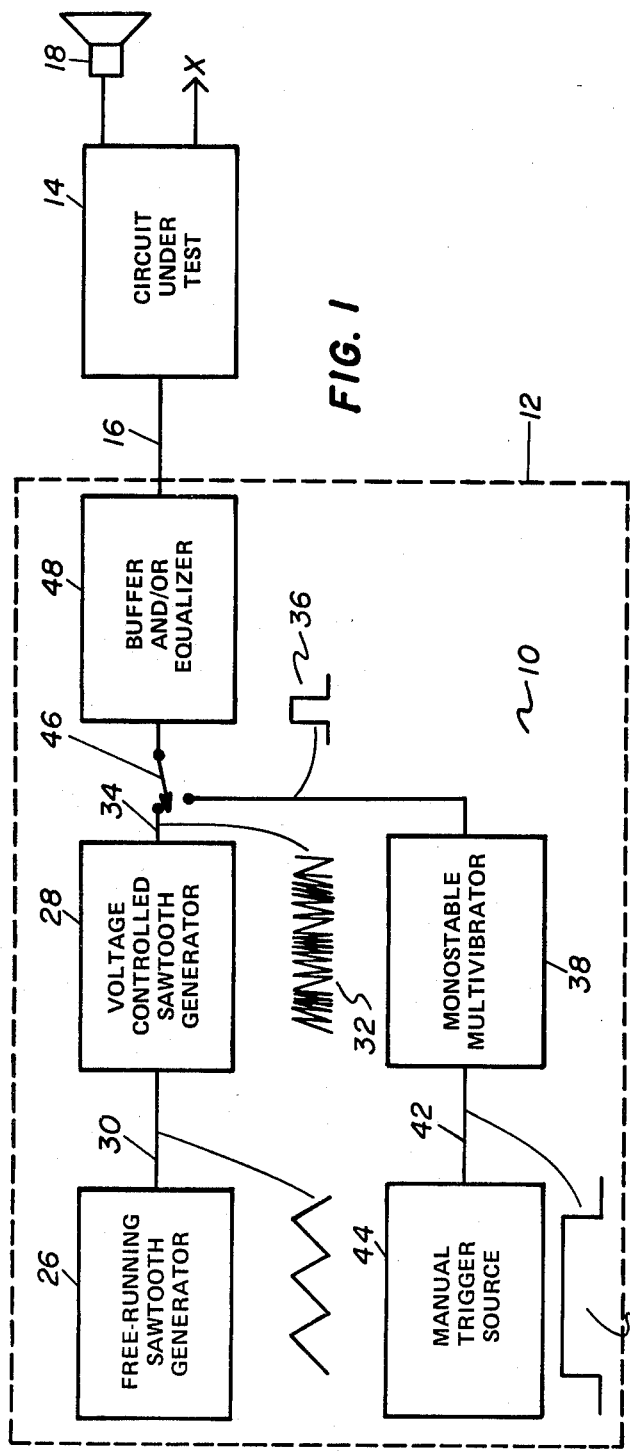
FIG. 1 is a block diagram of the signal generator connected to a circuit under test.
Figure 2:
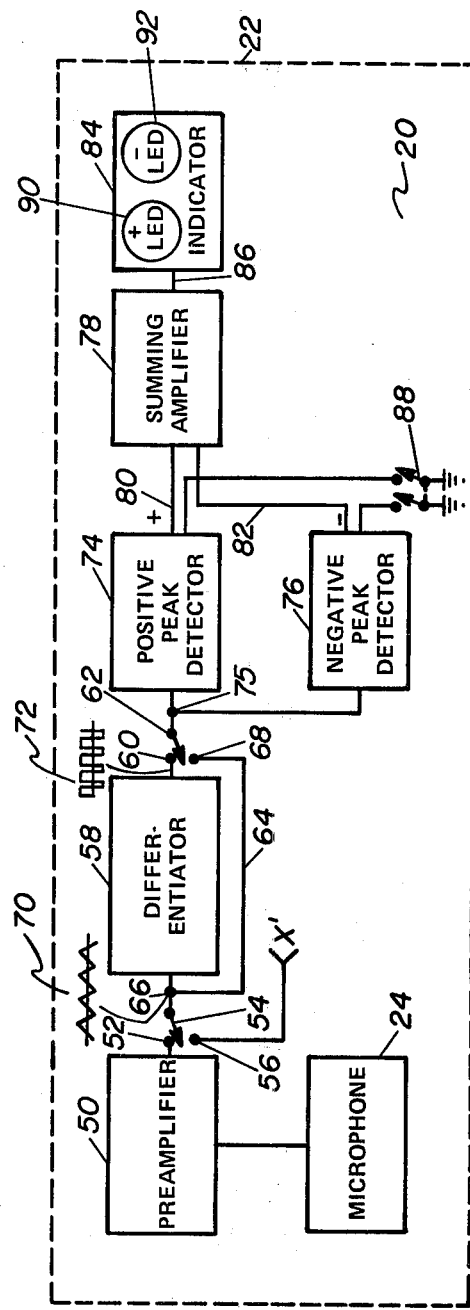
FIG. 2 is a block diagram of the signal processing circuitry coupled to the output of the circuit under test for phase inversion.

Referring now to FIGS. 1 and 2 the present invention comprises two major subassemblies for phase measurement testing. A signal generator source assembly 10, enclosed within first dash line 12, is electrically coupled to the input of a circuit under test 14 via electrical conductor 16. The output of a circuit under test 14 may be acoustical sound as generated by a loudspeaker 18 and/or in the form of electrical data as generated at output terminal plug "x". A signal processor circuit assembly 20, enclosed within second dash line 22, is coupled to the outputs of a circuit under test 14 by a microphone 24 or an input terminal jack "x".

The generator source assembly 10 comprises a free-running sawtooth generator 26 which has an output terminal which is electrically coupled to the input of a voltage controlled sawtooth generator via electrical conductor 30. The operating frequencies of the generators 26 and 28 are selected based on the nature of the circuit under test 14. The difference in slope of the rise and fall time of a repetative sawtooth waveform test signal 32 at the output 34 of the voltage controlled sawtooth generator 28 provides information that makes the present phase measurement possible. The repetative frequency sweeping permits the phase measurement of some frequency dependent circuitry or devices. Monolithic integrated circuits, well known in the art, are available to generate assymetrical test signals over a wide range of frequencies. A single pulse test signal 36 is also made available at the output of a monostable multivibrator 38. Multivibrator 38 is triggered by a debounced, single, wide pulse 40, via electrical conductor 42, from the output of a manual trigger source 44. A first single pole double throw switch 46 permits selection of either the repetitive different slope test wave form signal 32 or the single pulse test signal to be fed to the circuit under test 14 via an intermediate electrically coupled buffer and/or equalizer circuit member 48. The buffer portion 48 functions to lower the output impedance of the signal generator source 10 and thus insures drive capability into a wide range of loads. The equalizer portion 48 contours the test signal 32 in the frequency domain in the event that the signal processing circuitry 14 under test has a known frequency shaping characteristic. The sawtooth test signal 32 is used in the preferred embodiment to test limited bandwidth devices, for example woofers or loudspeakers having only good low frequency response. The signal pulse test signal 36 is used when testing wideband systems, such as linear amplifiers, for phase inversion.

Referring now to FIG. 2 the signal processor section 20 can accept either acoustically generated data through microphone 24 or the electrically generated data from plug x through jack input terminal x'. The acoustical signal received by microphone 24 is first amplified by an electrically coupled preamplifier 50 whose output is electrically connected to switch terminal 52 of a second single pole double throw (SPDT) selector switch 54. The jack input terminal x' is electrically coupled to the other switch terminal 56. The pole member of the second SPDT switch is connected to the input of a differentiator circuit 58 whose output terminal is electrically coupled to a first switch terminal 60 of a by-pass SPDT selector switch 62. A differentiator by-pass conductor 64 electrically couples junction point 66 to a second switch terminal 68 of by-pass SPDT selector switch 62. For acoustically generated, repetative waveform analysis of limited bandwith devices, selector switches 46, 54 and 62 are connected as shown in FIGS. 1 and 2. The signal 70 being tested for phase inversion is differentiated by differentiator 58 producing a waveform 72 whose shape is to be further discussed hereinafter. When it is desireous to use the present invention to test phase inversions in wide band systems, the present device is placed in a peak detector mode, differentiator 58 by-passed, by moving the by-pass SPDT switch 62 so that switch terminal 68 is connected to the pole member thereof and the switch 46 is moved to connect the monostable multivibrator 38 to the buffer 48. Positive and negative peak detectors 74 and 76 respectively have their inputs electrically connected to switch 62 at common junction point 75. The outputs of positive and negative peak detectors 74 and 76 are electrically coupled to the input of a summing amplifier 78 via electrical conductors 80 and 82 respectively. Positive and negative peak detectors 74 and 76 are adjusted to have equal magnitude gains. The output of the summing amplifier 78 is electrically connected to an indicator 84 via electrical conductor 86. The indicator 84 may comprise a meter, null indicating device or two light emitting diodes (LEDS), electrically connected in parallel, in a head-to-tail configuration. The polarity of the summing amplifier 78 output determines which LED will light to indicate phase. A double pole single throw switch 88 connected to ground potential is electrically coupled to the positive and negative peak detectors 74 and 76. Switch 88 is used to remove stored potential within detectors 74 and 76, and thus resets the detectors prior to single pulse testing.

In operation, for repetative waveform analysis, signal 70 is differentiated by differentiator 58 producing a waveform 72 primarily composed of two voltages proportional to the two slopes of the input sawtooth waveform 32. With the second SPDT selector switch 62 connected as shown in FIG. 2, the positive and negative peak detectors 74 and 76 respectively isolate the aforementioned proportional voltages and also integrate the frequency dependent variation within the signal sweep range. Under the condition where the sawtooth test signal 32 has a greater slope on the rising edge than on the falling edge, if the system 14 under test does not produce a phase inversion, the differentrator 58 will produce a waveform whose negative peak is large and proportional to the rising edge, and a positive peak somewhat smaller in magnitude and proportional the falling edge. This condition assumes that the differentiator 58 is of the inverting QP-AMP type. The positive peak detector 74 will generate a positive D.C. voltage at its output proportional to the positive peak of the differentiated wave 72 and, similarly the negative peak detector 76 will generate a negative D.C. voltage at its output proportional to the negative peak of the differentiated wave 72. Under the condition where the rising edge has a greater slope, the negative voltage output of the negative peak detector 76 is more negative than the positive voltage output of the positive peak detector 74 is positive. The summing amplifier, being of the inverting OP-AMP type amplifies the difference in the aforementioned output voltage and produces a large positive voltage. As previously discussed, since the light emitting diodes 90 and 92 of indicator 84, are connected in parallel, cathode-to-anode only the one with properly oriented polarity will light. LED 90 is labeled "+" representing no phase inversion. Should the system 14 under test cause an inversion, the waveform 72 at the output of differentiator 58 would be inverted, resulting in a polarity change at the output of the summing amplifier 78 and thereby lighting the "−" LED 92 and thereby representing the condition of a phase inversion.

In a similar fashion when it is desired to operate the system in a peak detector mode, by-pass switch 62 is changed from the position shown in FIG. 2 permitting the pole piece to contact terminal 68 and thereby bypass differentiator 58 output. Under this mode peak amplitudes of the single pulse test signal 36 and the pulse amplitude out of the circuit under test 14 are compared. The peak detectors 74 and 76 are reset to zero volts with switch 88 just prior to analyzing the generation of a non-repetative assymetrical waveform such as the single pulse test signal 36 from the output. The reset of the circuit operation remains the same as aforedescribed for the repetative waveform analysis. The system in the peak detector mode (differentiator 58 bypassed) allows the comparison of pulse signals above ground and below ground potential directly. A pulse generated exclusively above ground will produce a potential at the output of the positive peak detector 74 but not from the output of the negative peak detector; a negative pulse below ground will produce the converse. Although the peak detector mode requires far less circuitry than the repetative sawtooth waveform mode and therefore is cheaper, nevertheless it has limitation in use because the bandwith capability of the system under test must be great, (several decades) in order to properly pass the test pulse. On the other hand, since the sawtooth method requires less bandwith (the fundamental and second harmonic), the system under test, as represented in FIG. 1 by circuit under test 14, need only accurately reproduce one octave. The dual signal generators, selective switching means, and by-pass circuitry permit the present invention to test both limited bandwidth devices and broad band devices for phase inversion.

While there has been described and illustrated specific embodiments of the invention, it will be obvious that various changes, modifications and additions can be made herein without departing from the field of the invention which should be limited only by the scope of the appended claims.

Having thus fully described the invention, what is claimed as new and desired to be secured by Letters Patent of the United States is:

1. A device for testing phase inversion of a circuit under test which comprises:
   signal generator means for generating an assymetrical test signal;
   means for electrically coupling said assymetrical test signal to said circuit under test;
   means for receiving a plurality of output signals from said circuit under test;
   first switching means for selectively testing a first output signal of said plurality of output signals from said circuit under test;
   differentiator means electrically coupled to said first switching means for generating a plurality of voltages proportional to the slopes of said assymetrical test signal;
   means for electrically by-passing said differentiator means;
   polarity oriented peak detector means, electrically coupled to said means for electrically by-passing, for generating D.C. voltages and isolating said plurality of voltages porportional to the slopes of said assymetrical test signal when said differentiator means is utilized, said D.C. voltages are proportional to peak amplitudes of said assymetrical test signal when said differentiator means is by-passed, and for integrating frequency dependent variations within a sweep range of said assymetrical test signal;
   summing amplifier means for summing the output of said peak detector means and amplifying the difference between said D.C. voltages generated therefrom; and
   indicator means, electrically coupled to said amplifier means for registering a change in polarity in response to the output of said amplifier means, said indicator means calibrated to represent no phase inversion for a positive polarity indication from said indicator means and a phase inversion for a negative polarity indication from said indicator means.

2. A device for testing phase inversion as recited in claim 1 wherein said signal generator means comprises:
   a free-running sawtooth generator having a voltage output; and
   a voltage controlled sawtooth generator, electrically coupled to said free-running sawtooth generator, generates a repetitive swept frequency assymetrical waveform at an output thereof.

3. A device for testing phase inversion as recited in claim 2 wherein said signal generator means comprises:
   a manual trigger source means for initiating a pulse signal; and
   a monostable multivibrator, electrically coupled to said manual trigger source means for generating a single assymetrical pulse test signal.

4. A device for testing phase inversion as recited in claims 2 or 3 wherein said means for electrically coupling comprises:
   a first single pole double throw switch having a first switch terminal electrically connected to the output of said voltage controlled sawtooth generator and a second switch terminal electrically connected to an output of said monostable multivibrator; and
   a buffer and/or equalizer circuit member electrically coupled to a pole member terminal of said first single pole double throw switch, said buffer and/or equalizer circuit member operatively functioning to lower the output impedance of said signal generator means.

5. A device for testing phase inversion as recited in claim 4 wherein said means for receiving a plurality of output signals comprises:
   a microphone operatively positioned proximate to an acoustic output of said circuit under test;
   a preamplifier, electrically coupled to said microphone, having an output electrically connected to a first switch terminal of said first switching means; and
   an input terminal jack electrically coupled to a second switch terminal of said first switching means which includes a second single pole double throw selector switch.

6. A device for testing phase inversion as recited in claim 5 wherein said means for electrically by-passing said differentiator means comprises:
   a by-pass conductor having one end electrically coupled to a common junction point intermediate said second single pole double throw selector switch and said differentiator means and an other end;
   a by-pass single pole double throw switch having a first switch terminal electrically coupled to an output of said differentiator means and a second switch terminal electrically connected to said other end of said by-pass conductor, and a pole member electrically connected to a common input junction of said polarity oriented peak detector means.

7. A device for testing phase inversion as recited in claim 6 wherein said polarity oriented polar detector means comprises:
   a positive peak detector having an input electrically coupled to said common junction of said peak detector means and an output electrically coupled to a first input of said summing amplifier means; and a negative peak detector having an input electrically coupled to said common junction of said peak detector means and an output electrically coupled to a second input of said summing amplifier means.

8. A device for testing phase inversion as recited in claim 7 wherein said indicator means comprises:

a first light emiting diode electrically coupled to an output of said summing amplifier means, said light emiting diode being activated when a positive resultant voltage is generated by said summing amplifier means and indicating thereby no phase inversion;

a second light emiting diode electrically connected in parallel and in reverse polarity with said first light emiting diode, said light emiting diode being activated when a negative resultant voltage is generated by said summing amplifier means, indicating thereby a phase inversion.

* * * * *